(12) United States Patent
Ui et al.

(10) Patent No.: US 11,547,031 B2
(45) Date of Patent: Jan. 3, 2023

(54) ELECTROMAGNETIC WAVE ABSORBER

(71) Applicant: NITTO DENKO CORPORATION, Ibaraki (JP)

(72) Inventors: Takehiro Ui, Osaka (JP); Hiroichi Ukei, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 505 days.

(21) Appl. No.: 16/621,487

(22) PCT Filed: Jun. 12, 2018

(86) PCT No.: PCT/JP2018/022480
§ 371 (c)(1),
(2) Date: Dec. 11, 2019

(87) PCT Pub. No.: WO2018/230578
PCT Pub. Date: Dec. 20, 2018

(65) Prior Publication Data
US 2020/0178426 A1 Jun. 4, 2020

(30) Foreign Application Priority Data
Jun. 14, 2017 (JP) .............................. JP2017-116770

(51) Int. Cl.
*B32B 3/00* (2006.01)
*H05K 9/00* (2006.01)
(Continued)

(52) U.S. Cl.
CPC ........... *H05K 9/0081* (2013.01); *B32B 7/025* (2019.01); *B32B 15/046* (2013.01); *B32B 15/08* (2013.01);
(Continued)

(58) Field of Classification Search
CPC .. B32B 7/025; B32B 2307/212; H05K 9/0081
See application file for complete search history.

(56) References Cited

U.S. PATENT DOCUMENTS

| | | | |
|---|---|---|---|
| 5,275,880 A | 1/1994 | Boyer, III et al. | |
| 2005/0030218 A1 | 2/2005 | Kondo et al. | |

(Continued)

FOREIGN PATENT DOCUMENTS

| | | |
|---|---|---|
| JP | 2002-118008 A | 4/2002 |
| JP | 2002-374091 A | 12/2002 |

(Continued)

OTHER PUBLICATIONS

International Search Report dated Sep. 11, 2018, issued in counterpart International Application No. PCT/JP2018/022480 (2 pages).

(Continued)

*Primary Examiner* — Elizabeth E Mulvaney
(74) *Attorney, Agent, or Firm* — WHDA, LLP

(57) ABSTRACT

An electromagnetic wave absorber includes an electromagnetic wave-absorbing layer (10) and an adhesive layer (20). The adhesive layer (20) is disposed on at least one surface of the electromagnetic wave-absorbing layer (10). The electromagnetic wave absorber is capable of being adhered to a surface having a step in such a manner that the adhesive layer (20) is in contact with the surface. The adhesive layer (20) has a thickness equal to or greater than a reference height determined by subtracting 0.1 mm from the height of the step. In the electromagnetic wave absorber, a return loss ΔR defined by ΔR=Rt−Rr is 15 dB or more. Rt is a reflection amount of a 76-GHz electromagnetic wave and is measured for a reference specimen. Rr is a reflection amount of a 76-GHz electromagnetic wave and is measured for a specimen obtained by adhering the electromagnetic wave absorber.

8 Claims, 2 Drawing Sheets

(51) Int. Cl.
   *B32B 7/025* (2019.01)
   *B32B 15/04* (2006.01)
   *B32B 15/08* (2006.01)

(52) U.S. Cl.
   CPC ...... *H05K 9/0084* (2013.01); *B32B 2307/212* (2013.01)

(56) References Cited

U.S. PATENT DOCUMENTS

| | | |
|---|---|---|
| 2014/0154500 A1 | 6/2014 | Araki et al. |
| 2014/0256877 A1 | 9/2014 | Miki et al. |

FOREIGN PATENT DOCUMENTS

| | | | |
|---|---|---|---|
| JP | 2003-198179 A | 7/2003 | |
| JP | 2003-218581 A | 7/2003 | |
| JP | 2007-30534 A | 2/2007 | |
| JP | 2007-30535 A | 2/2007 | |
| JP | 2011-249613 A | 12/2011 | |
| JP | 2012-94764 A | 5/2012 | |
| JP | 2012-251143 A | 12/2012 | |
| JP | 2014-172999 A | 9/2014 | |
| JP | 2016-94569 A | 5/2016 | |
| JP | 2016-94589 A | 5/2016 | |
| WO | WO-2018084235 A1 * | 5/2018 | ............. B32B 25/02 |

OTHER PUBLICATIONS

Extended (Supplementary) European Search Report dated Feb. 12, 2021, issued in counterpart EP Application No. 18817219.1 (11 pages).

Office Action dated May 25, 2021, issued in counterpart JP application No. 2017-116770, with English translation. (8 pages).

Office Action dated Jun. 21, 2022, issued in counterpart JP application No. 2017-116770, with English translation. (10 pages).

* cited by examiner

ELECTROMAGNETIC WAVE ABSORBER

TECHNICAL FIELD

The present invention relates to an electromagnetic wave absorber.

BACKGROUND ART

In recent years, electromagnetic waves in a range of millimeter waves having a wavelength of about 1 to 10 mm and a frequency of 30 to 300 GHz and quasi-millimeter waves have been used as information communication media. The use of such electromagnetic waves in anti-collision systems has been under consideration. An anti-collision system is a system, for example, installed in a vehicle, detecting obstacles to automatically put on the brakes, or measuring the speed of vehicles around the vehicle equipped with the system and distance between the vehicle and another vehicle to adjust the speed of the vehicle and distance between the two vehicles.

For example, Patent Literature 1 describes a structure disposed at the front portion of an automobile body and including a millimeter-wave radar, a pair of shroud stays, and a mounting plate used to mount the millimeter-wave radar thereon. Both the left and right ends of the mounting plate are fixed to the pair of shroud stays by bolts and nuts. The mounting plate has three mounting portions, each of which is provided with a positioning bolt. Three fixing pieces of a case of the millimeter-wave radar are engaged with these positioning bolts in such a manner that the positions of the three fixing pieces can be freely adjusted back and forth.

Patent Literature 2 describes a radar unit mounting structure including a shroud upper, shroud lower, and shroud stays coupling the shroud upper and shroud lower. In the mounting structure, a radar unit is mounted on the shroud stays. The upper portions of the shroud stays are coupled to the shroud upper in such a manner that the upper portions of the shroud stays are uncoupled from the shroud upper when a load equal to or higher than a given load is imposed from the front side. Therefore, when a load equal to or higher than a given load is imposed from the front side in the event of a minor vehicle collision, the upper portions of the shroud stays are uncoupled from the shroud upper and the radar unit mounted on the shroud stays moves backwards. This can reduce impact imposed on the radar unit and can prevent damage to the radar unit.

It is thought that reception of as few unnecessary electromagnetic waves as possible is important to prevent false recognition and allows anti-collision systems to normally operate. Therefore, it is conceivable that electromagnetic wave absorbers that absorb unnecessary electromagnetic waves are used in anti-collision systems.

There are various types of electromagnetic wave absorbers classified according to their principles of electromagnetic wave absorption. For example, an electromagnetic wave absorber provided with an electromagnetic wave reflective layer, a dielectric layer having a thickness of λ/4 (λ is the wavelength of an electromagnetic wave to be absorbed), and a resistive film layer (such an electromagnetic wave absorber may be referred to as "λ/4 electromagnetic wave absorber") can be produced at a low cost owing to relatively inexpensive materials and ease of design. For example, Patent Literature 3 proposes, as a λ/4 electromagnetic wave absorber, an electromagnetic wave absorber exercising an excellent property of functioning in a wide incident angular range. Additionally, Patent Literature 4 describes an electromagnetic wave absorption material having a magnetic layer.

CITATION LIST

Patent Literature

Patent Literature 1: JP 2007-030534 A
Patent Literature 2: JP 2007-030535 A
Patent Literature 3: JP 2003-198179 A
Patent Literature 4: JP 2012-094764 A

SUMMARY OF INVENTION

Technical Problem

Patent Literatures 1 and 2 do not describe mounting of an electromagnetic wave absorber on a part disposed near a millimeter-wave radar and having a step. Additionally, Patent Literature 2 does not describe detachment of an electromagnetic wave absorber upon impact imposed on the radar unit, either. Moreover, Patent Literatures 3 and 4 fail to specifically discuss the shapes of articles on which an electromagnetic wave absorber is mounted.

Therefore, the present invention provides an electromagnetic wave absorber that is likely to exhibit good electromagnetic wave absorption performance when the electromagnetic wave absorber is mounted on a part disposed near a millimeter-wave radar and having a step.

Solution to Problem

The present invention provides an electromagnetic wave absorber including:

an electromagnetic wave-absorbing layer; and an adhesive layer that is disposed on at least one surface of the electromagnetic wave-absorbing layer, wherein the electromagnetic wave absorber is capable of being adhered to a surface having a step in such a manner that the adhesive layer is in contact with the surface, the adhesive layer has a thickness equal to or greater than a reference height determined by subtracting 0.1 mm from the height of the step, and a return loss $\Delta R$ defined by the following equation is 15 dB or more:

$$\Delta R = Rt - Rr$$

wherein: Rt is a reflection amount of a 76-GHz electromagnetic wave and is measured according to Japanese Industrial Standards (JIS) R 1679:2007 for a reference specimen obtained by bringing an adhesive layer of a sample into contact with a first surface having a step equal to or lower than a reference thickness determined by adding 0.1 mm to the thickness of the adhesive layer of the electromagnetic wave absorber to adhere the sample to the first surface, the sample consists of a metal foil-including electrically conductive layer and the adhesive layer, and the adhesive layer of the sample is of the same type as the adhesive layer of the electromagnetic wave absorber; and Rr is a reflection amount of a 76-GHz electromagnetic wave and is measured according to JIS R 1679:2007 for a specimen obtained by bringing the adhesive layer of the electromagnetic wave absorber into contact with a second surface that has the same surface shape as a surface shape of the first surface to adhere the electromagnetic wave absorber to the second surface.

Advantageous Effects of Invention

The above electromagnetic wave absorber is likely to exhibit good electromagnetic wave absorption performance even when the electromagnetic wave absorber is mounted on a part disposed near a millimeter-wave radar and having a step. Moreover, in some cases, the electromagnetic wave absorber is unlikely to drop off the part when impact is applied to the millimeter-wave radar.

DESCRIPTION OF EMBODIMENT

Hereinafter, embodiments of the present invention will be described with reference to the drawings. The following description describes examples of the present invention, and the present invention is not limited to the following embodiments.

When a portion of an emitted millimeter wave is reflected by a part disposed near a millimeter-wave radar of an anti-collision system and received by the millimeter-wave radar, false recognition may occur in the anti-collision system. Therefore, it is thought important for anti-collision systems to receive as few unnecessary electromagnetic waves as possible for prevention of false recognition. For example, it is conceivable to mount an electromagnetic wave absorber on a part, such as the mounting plate described in Patent Literature 1, disposed near a millimeter-wave radar. To easily mount an electromagnetic wave absorber on such a part, the electromagnetic wave absorber desirably has an adhesive layer.

However, the surface of a part disposed near a millimeter-wave radar may have a step provided by a fastener such as a bolt or nut, as the mounting plate described in Patent Literature 1 does. Moreover, the surface of a part disposed near a millimeter-wave radar may have a step depending on the shape of the part. Most automobile parts, in particular, have a complex shape, and thus tend to have a large step. The present inventors have newly found that when an electromagnetic wave absorber is mounted on a part having a step with the use of, for example, a conventional pressure-sensitive adhesive tape, the electromagnetic wave absorber may distort due to the step of the part and the electromagnetic wave absorber may not be able to exhibit desired electromagnetic wave absorption performance. Therefore, the present inventors conducted intensive studies to discover a technique for making it possible for an electromagnetic wave absorber including an adhesive layer and mounted on a part having a step to achieve good electromagnetic wave absorption performance. Consequently, an electromagnetic wave absorber according to the present invention has been invented. The present inventors also studied for a technique for making it unlikely that the electromagnetic wave absorber drops off a part having a step upon impact imposed on a millimeter-wave radar.

Figure 1:
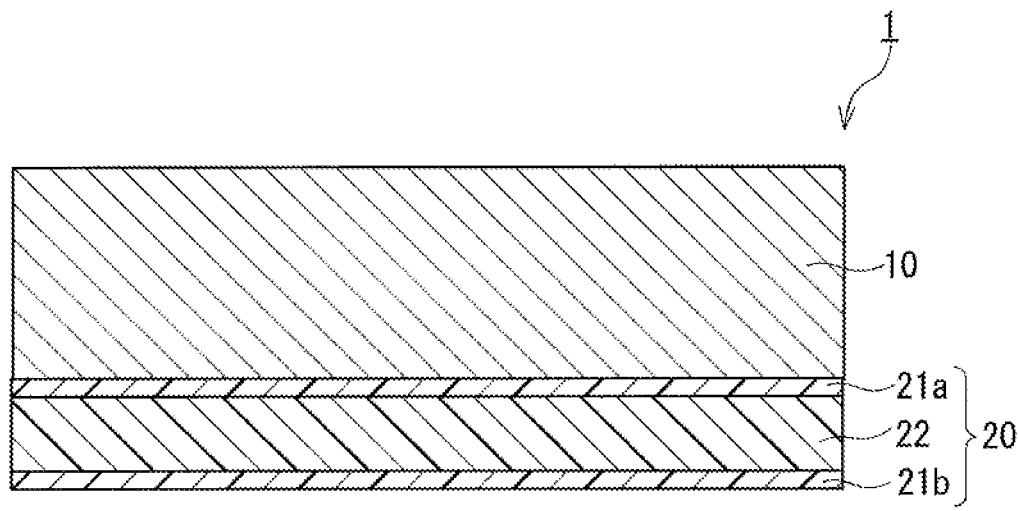
FIG. 1 is a cross-sectional view showing an example of an electromagnetic wave absorber of the present invention.
Figure 2:
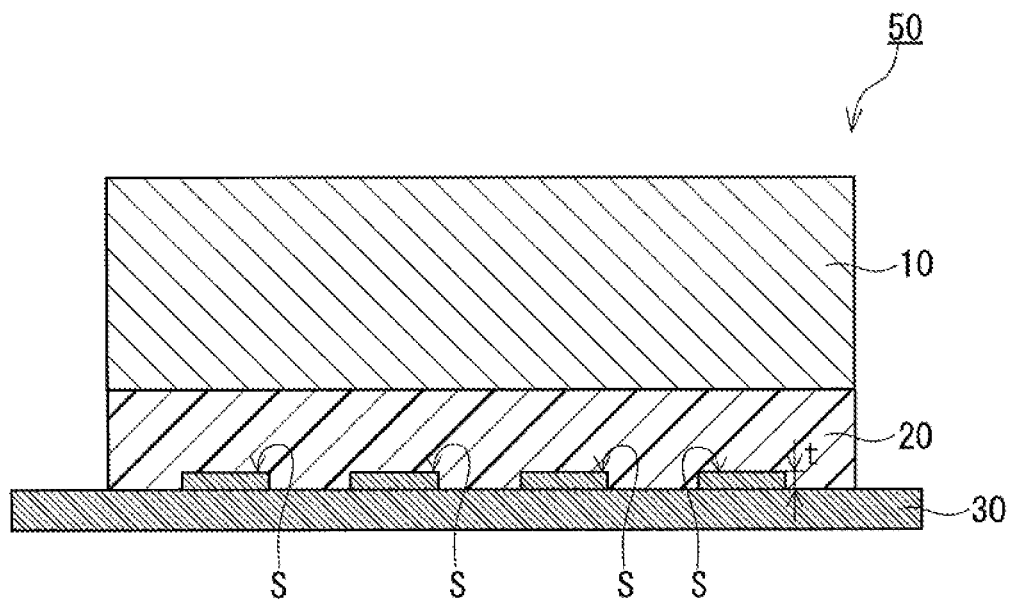
FIG. 2 is a cross-sectional view showing a state where the electromagnetic wave absorber shown in FIG. 1 is mounted on a part having a step.

As shown in FIG. 1, an electromagnetic wave absorber 1 includes an electromagnetic wave-absorbing layer 10 and an adhesive layer 20. The adhesive layer 20 is disposed on at least one surface of the electromagnetic wave-absorbing layer 10. As shown in FIG. 2, the electromagnetic wave absorber 1 is capable of being adhered to a surface having a step in such a manner that the adhesive layer 20 is in contact with the surface. Moreover, the adhesive layer 20 has a thickness equal to or greater than a reference height determined by subtracting 0.1 mm from the height of the step on the surface. Furthermore, a return loss $\Delta R$ defined by the following equation (1) is 15 dB or more:

$$\Delta R = Rt - Rr \quad \text{Equation (1)}$$

wherein: Rt is a reflection amount of a 76-GHz electromagnetic wave and is measured according to Japanese Industrial Standards (JIS) R 1679:2007 for a reference specimen obtained by bringing an adhesive layer of a sample into contact with a first surface having a step equal to or lower than a reference thickness determined by adding 0.1 mm to the thickness of the adhesive layer 20 of the electromagnetic wave absorber 1 to adhere the sample to the first surface, the sample consists of a metal foil-including electrically conductive layer and the adhesive layer, and the adhesive layer of the sample is of the same type as the adhesive layer 20 of the electromagnetic wave absorber 1; and Rr is a reflection amount of a 76-GHz electromagnetic wave and is measured according to JIS R 1679:2007 for a specimen obtained by bringing the adhesive layer 20 of the electromagnetic wave absorber 1 into contact with a second surface that has the same surface shape as a surface shape of the first surface to adhere the electromagnetic wave absorber 1 to the second surface.

The reflection amounts Rt and Rr as used herein refer to the reflection amounts measured for a reference specimen and specimen, respectively, upon perpendicular incidence of a 76-GHz electromagnetic wave.

The electromagnetic wave absorber 1, for which the return loss $\Delta R$ is 15 dB or more, is likely to exhibit good electromagnetic wave absorption performance when the adhesive layer 20 is brought into contact with a surface having a step to adhere the electromagnetic wave absorber 1 thereto.

In the electromagnetic wave absorber 1, the thickness of the adhesive layer 20 is not particularly limited as long as the adhesive layer 20 has a thickness equal to or greater than the reference height. For example, the adhesive layer 20 has a thickness of 0.5 mm to 15 mm. In this case, for example, as shown in FIG. 2, when the adhesive layer 20 is brought into contact with a surface having a step S to adhere the electromagnetic wave absorber 1 thereto, the adhesive layer 20 is likely to change its shape to eliminate the unevenness attributable to the step S on the surface. Therefore, when the adhesive layer 20 is brought into contact with the surface having the step S to adhere the electromagnetic wave absorber 1 thereto, the electromagnetic wave-absorbing layer 10 is unlikely to be affected by the step S on the surface and is unlikely to be distorted. Consequently, when the adhesive layer 20 is brought into contact with the surface having the step S to adhere the electromagnetic wave absorber 1 thereto, the electromagnetic wave absorber 1 is likely to exhibit good electromagnetic wave absorption performance. Moreover, even when a part including the surface having the step S is distorted by a collision with an object around a vehicle, the stress caused by the distortion of the part can be reduced by the adhesive layer 20. Thus, the stress at the interface between the adhesive layer 20 and the surface having the step S is reduced and the electromagnetic wave absorber 1 is unlikely to be detached from the part.

Figure 3:
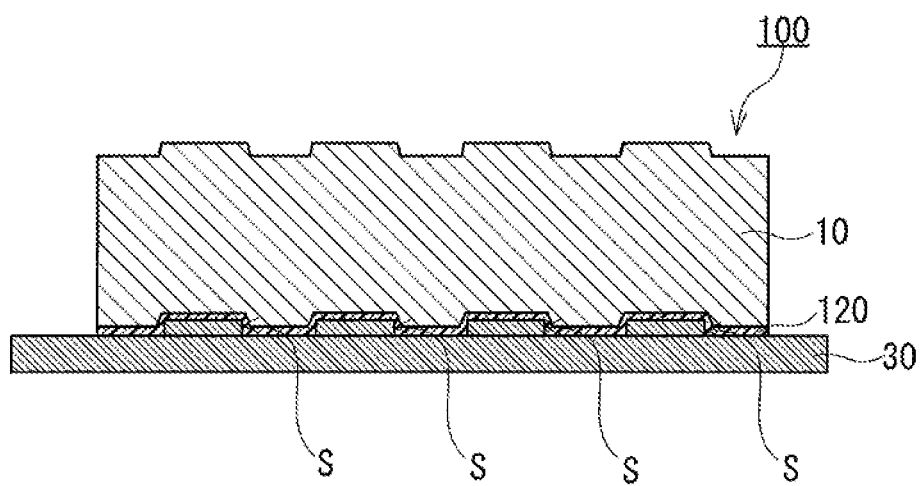
FIG. 3 is a cross-sectional view showing a state where an electromagnetic wave absorber according to a comparative example is mounted on a part having a step.

As shown in FIG. 3, an electromagnetic wave absorber 100 according to a comparative example includes an electromagnetic wave-absorbing layer 10 and an adhesive layer 120. The adhesive layer 120 is provided on one surface of the electromagnetic wave-absorbing layer 10. In the electromagnetic wave absorber 100, the adhesive layer 120 has a thickness less than the reference height determined by subtracting 0.1 mm from the height of a step S. As shown in FIG. 3, when the adhesive layer 120 is brought into contact with a surface having the step S to adhere the electromagnetic wave absorber 100 thereto, the adhesive layer 120 is unlikely to eliminate the unevenness attributable to the step S on the surface, and the electromagnetic wave-absorbing layer 10 is likely to be distorted because of the step S on the surface. As a result, when the adhesive layer 20 is brought into contact with the surface having the step S to adhere the electromagnetic wave absorber 100 thereto, the electromagnetic wave absorber 100 is unlikely to exhibit good electromagnetic wave absorption performance.

The adhesive layer 20 has a Young's modulus (tensile elastic modulus) of 2000 MPa or less, for example, at 23° C. This makes it likely that when the adhesive layer 20 is brought into contact with the surface having the step S to adhere the electromagnetic wave absorber 1 thereto, the adhesive layer 20 changes its shape to conform to the shape of the step. This makes it likely that when the adhesive layer 20 is brought into contact with the surface having the step S to adhere the electromagnetic wave absorber 1 thereto, the electromagnetic wave absorber 1 is likely to exhibit good electromagnetic wave absorption performance. The Young's modulus of the adhesive layer 20 can be measured, for example, according to JIS K 7161-1. The elastic modulus of the adhesive layer 20 is desirably 2000 MPa or less and more desirably 100 MPa or less, for example, at 23° C. Moreover, when the Young's modulus of the adhesive layer 20 is within the above range at 23° C., the stress caused by collision-induced distortion of a part can be reduced by the adhesive layer 20 and thus the electromagnetic wave absorber 1 is unlikely to be detached from an adherend such as the part. Automobiles are used in a wide temperature range from low to high temperatures. Therefore, for example, when the electromagnetic wave absorber 1 is adhered to an automobile part, the Young's modulus of the electromagnetic wave absorber 1 is desirably 2000 MPa or less, more desirably 500 MPa or less, and even more desirably 300 MPa or less even at a temperature as low as −30° C.

As shown in FIG. 1, the adhesive layer 20 includes, for example, a supporting layer 22. In this case, the supporting layer 22 makes it easy to adjust the thickness of the adhesive layer 20 to fall within the desired range. Therefore, when the adhesive layer 20 is brought into contact with a surface having a step to adhere the electromagnetic wave absorber 1 thereto, the adhesive layer 20 is likely to change its shape to eliminate the unevenness attributable to the step on the surface.

When the adhesive layer 20 includes the supporting layer 22, the adhesive layer 20 further includes, for example, a first adhesive agent layer 21a and a second adhesive agent layer 21b, as shown in FIG. 1. The first adhesive agent layer 21a is disposed between the electromagnetic wave-absorbing layer 10 and supporting layer 22 and is in contact with the electromagnetic wave-absorbing layer 10 and supporting layer 22. The supporting layer 22 is disposed between the first adhesive agent layer 21a and second adhesive agent layer 21b and is in contact with the first adhesive agent layer 21a and second adhesive agent layer 21b.

The supporting layer 22 is made of, for example, a foam. In this case, when the adhesive layer 20 is brought into contact with a surface having a step to adhere the electromagnetic wave absorber 1 thereto, the adhesive layer 20 is likely to change its shape to eliminate the unevenness attributable to the step on the surface. The supporting layer 22 is typically a flexible foam.

The supporting layer 22 includes, for example, at least one selected from the group consisting of polyethylene terephthalate, polyethylene naphthalate, acrylic resin, polycarbonate, cycloolefin polymer, polyurethane, acrylic urethane resin, polyolefin, polyethylene, polypropylene, synthetic rubber, polyvinyl chloride, and polyvinylidene chloride as a main component. The term "main component" as used herein refers to a component whose content is highest on a mass basis.

The supporting layer 22 may be made of an elastomer.

The adhesive layer 20 may not necessarily include the supporting layer 22, and may be a single layer formed of, for example, a pressure-sensitive adhesive.

Examples of the pressure-sensitive adhesive used for the adhesive layer 20 include, but are not particularly limited to, acrylic pressure-sensitive adhesives, urethane pressure-sensitive adhesives, rubber pressure-sensitive adhesives, and silicone pressure-sensitive adhesives.

As shown in FIG. 2, an electromagnetic wave absorbing structure 50 can be produced by bringing the adhesive layer 20 of the electromagnetic wave absorber 1 into contact with a stepped surface of a part 30 having the step S to adhere the electromagnetic wave absorber 1 to the part 30. For example, when the height of the step S is represented by t (e.g., 0.1 mm to 5 mm), the thickness of the adhesive layer 20 is t−0.1 mm or more. The thickness of the adhesive layer 20 is desirably t+0.5 mm or more, more desirably t+1.0 mm or more, even more desirably, t+1.5 mm or more, and most desirably t+2.0 mm or more. This makes it possible to easily mount the electromagnetic wave absorber 1 on the part 30 and makes it likely that the electromagnetic wave absorber 1 exhibits good electromagnetic wave absorption properties regardless of the step S on the surface of the part 30. The thickness of the adhesive layer 20 is desirably 0.5 to 10 mm, more desirably 0.7 to 5 mm, and even more desirably 1.0 to 3.0 mm. This makes it possible to easily mount the electromagnetic wave absorber 1 on the part 30 and makes it likely that the electromagnetic wave absorber 1 exhibits good electromagnetic wave absorption properties regardless of the step S on the surface of the part 30.

The electromagnetic wave absorber 1 is, for example, a λ/4 electromagnetic wave absorber, dielectric loss-type electromagnetic wave absorber, or magnetic loss-type electromagnetic wave absorber. A dielectric loss-type electromagnetic wave absorber absorbs an electromagnetic wave using a dielectric loss attributed to molecular polarization. A magnetic loss-type electromagnetic wave absorber absorbs an electromagnetic wave by means of a magnetic loss of a magnetic material.

The electromagnetic wave-absorbing layer 10 typically has an electrically conductive layer (electromagnetic wave reflective layer). The electrically conductive layer includes, for example, a metal, and desirably includes a metal foil or vapor-deposited metal film. It should be noted that alloys are included in metals herein. Examples of the metal included in the electrically conductive layer include copper, nickel, zinc, their alloys, aluminum, gold, silver, and stainless steel.

The electrically conductive layer may include a support which is a polymer sheet. In this case, the electrically conductive layer can be produced easily by forming a layer of the metallic material on the support. Examples of the material of the polymer sheet usable as the support of the electrically conductive layer include polyethylene terephthalate (PET), polyethylene naphthalate (PEN), acrylic resin, polycarbonate (PC), polyolefin, polyethylene (PE), polypropylene (PP), cycloolefin polymer (COP), polyurethane, urethane acrylic resin, cast polypropylene (CPP), and vinylidene chloride resin. The electrically conductive layer may be, for example, a laminate in which a resin film such as a polyester resin film is laminated on one surface or both surfaces of a metal foil.

Typically, the electrically conductive layer of the electromagnetic wave-absorbing layer 10 is in contact with the adhesive layer 20.

When the electromagnetic wave absorber 1 is λ/4 electromagnetic wave absorber, the electromagnetic wave-absorbing layer 10 further includes a dielectric layer having a thickness of λ/4 (λ is the wavelength of an electromagnetic wave to be absorbed) and resistive layer. The dielectric layer is disposed between the resistive layer and electrically conductive layer. In the λ/4 electromagnetic wave absorber, the wavelength ($\lambda_O$) of an electromagnetic wave to be absorbed is determined according to the thickness (t) of the dielectric layer and the relative permittivity ($\varepsilon_r$) of the dielectric layer, as shown in the following equation (2). That is, an electromagnetic wave having a wavelength to be absorbed can be determined by appropriately adjusting the material and thickness of the dielectric layer. In the equation (2), sqrt($\varepsilon r$) means a square root of the relative permittivity ($\varepsilon r$).

$$\lambda_O = 4t \times \text{sqrt}(\varepsilon_r) \quad \text{Equation (2)}$$

When the electromagnetic wave absorber 1 is a λ/4 electromagnetic wave absorber, the dielectric layer is formed of a polymer sheet having a relative permittivity of, for example, 1 to 20. The dielectric layer is more desirably formed of a polymer sheet having a relative permittivity of 2 to 20. This makes it likely that the electromagnetic wave absorber 1 exhibits the desired electromagnetic wave absorption properties. The relative permittivity of the dielectric layer can be measured, for example, by a free-space method.

Examples of the material of the polymer sheet of the dielectric layer include synthetic resins such as ethylene-vinyl acetate copolymer (EVA), polyvinyl chloride, polyurethane, acrylic resin, acrylic urethane resin, polyolefin, polypropylene, polyethylene, silicone resin, polyethylene terephthalate, polyester, polystyrene, polyimide, polycarbonate, polyamide, polysulfone, polyethersulfone, and epoxy resin and synthetic rubbers such as polyisoprene rubber, polystyrene-butadiene rubber, polybutadiene rubber, chloroprene rubber, acrylonitrile-butadiene rubber, butyl rubber, acrylic rubber, ethylene propylene rubber, and silicone rubber. One of these may be used alone as the material of the polymer sheet of the dielectric layer, or a combination of two or more thereof may be used as the material of the polymer sheet of the dielectric layer.

The dielectric layer may be a single layer, or may be a laminate consisting of a plurality of layers. When the dielectric layer is a laminate consisting of a plurality of layers, the relative permittivity of the dielectric layer can be determined by measuring the respective layers for the relative permittivity, multiplying the obtained relative permittivity values of the respective layers by the proportions of the thicknesses of the respective layers to the thickness of the whole dielectric layer, and adding the resultant values.

The sheet resistance of the resistive layer is, for example, 200 to 600Ω/□ and desirably 300 to 500Ω/□. This makes it easy for the electromagnetic wave absorber 1 to selectively absorb an electromagnetic wave having a wavelength generally employed by a millimeter-wave radar or quasi-millimeter-wave radar. For example, the electromagnetic wave absorber 1 can effectively attenuate an electromagnetic wave having a frequency of 20 to 90 GHz, particularly 60 to 90 GHz, employed by a millimeter-wave radar.

The resistive layer includes, for example, a layer (hereinafter referred to as "functional layer") formed of: a metal oxide including at least one selected from the group consisting of indium, tin, and zinc as a main component; an electrically conductive polymer; a carbon nanotube; a metal nanowire; or a metal mesh. In particular, the functional layer of the resistive layer is desirably formed of indium tin oxide (ITO) in terms of the stability of the sheet resistance in the resistive layer and the durability of the resistive layer. In this case, the material forming the functional layer of the resistive layer is desirably an ITO including 20 to 40 weight % of $SnO_2$ and more desirably an ITO including 25 to 35 weight % of $SnO_2$. An ITO including $SnO_2$ in such a range has an extremely stable amorphous structure and can reduce variation in sheet resistance of the resistive layer in a hot and humid environment. The sheet resistance of the resistive layer refers to a value measured for, for example, a surface defined by the functional layer. The thickness of the functional layer of the resistive layer is, for example, 10 to 100 nm and desirably 25 to 50 nm. This makes it likely that the sheet resistance of the resistive layer is stable even when the electromagnetic wave absorber 1 is affected by a time-dependent change or an environmental change.

The resistive layer may further include, for example, a support supporting the functional layer. In this case, the resistive layer can be produced, for example, by forming the functional layer on the support by a layer forming method such as sputtering or coating (for example, bar coating). In this case, the support also serves as an auxiliary member capable of adjusting the thickness of the functional layer with high accuracy. Examples of the material of the support of the resistive layer include materials mentioned as examples of the materials of the support of the electrically conductive layer. The material of the support of the resistive layer may be the same as or different from the material of the support of the electrically conductive layer. In particular, the material of the support of the resistive layer is desirably PET in terms of the balance among good heat resistance, the dimensional stability, and cost. The support can be omitted from the resistive layer as appropriate.

In the resistive layer including the support, the functional layer may be disposed closer to the first layer than is the support, or the support may be disposed closer to the first layer than is the functional layer.

When the electromagnetic wave absorber 1 is a λ/4 electromagnetic wave absorber and the dielectric layer is disposed on the external side of the resistive layer, only a non-porous layer having a relative permittivity of 2 or more is disposed as such a dielectric layer. If a porous body is provided on a surface of an electromagnetic wave absorber and the electromagnetic wave absorber is left in a humid environment over a long period of time, the electromagnetic wave absorbing properties of the electromagnetic wave absorber may decrease due to moisture absorption.

When the electromagnetic wave absorber 1 is a dielectric loss-type electromagnetic wave absorber, the electromagnetic wave-absorbing layer 10 includes a dielectric layer in addition to the electrically conductive layer and does not include a resistive layer. The electrically conductive layer is disposed between the dielectric layer and adhesive layer 20. In the dielectric loss-type electromagnetic wave absorber, the molecular polarization cannot follow a change in an electric field and the energy of an electromagnetic wave is lost as heat. The dielectric layer in the dielectric loss-type electromagnetic wave absorber has a structure in which, for example, a dielectric loss material such as carbon particles are dispersed in any of the above synthetic resins and synthetic rubbers mentioned as examples of the material of the polymer sheet serving as a dielectric layer in a λ/4 electromagnetic wave absorber.

When the electromagnetic wave absorber 1 is a magnetic loss-type electromagnetic wave absorber, the electromagnetic wave-absorbing layer 10 includes a magnetic layer in addition to the electrically conductive layer and does not include a resistive layer. The electrically conductive layer is disposed between the magnetic layer and adhesive layer 20. In the magnetic loss-type electromagnetic wave absorber, a magnetic moment cannot follow a change in a magnetic field and the energy of an electromagnetic wave is lost as heat. The magnetic layer in the magnetic loss-type electromagnetic wave absorber has a structure in which, for example, particles of a magnetic material such as ferrite, iron, or nickel are dispersed in any of the above synthetic resins and synthetic rubbers mentioned as examples of the material of the polymer sheet serving as a dielectric layer in a λ/4 electromagnetic wave absorber.

EXAMPLES

Hereinafter, the present invention will be described in more detail by examples. The present invention is not limited to the examples given below.

Example 1

On a surface of a 38-μm-thick PET film, a functional layer was formed to have a sheet resistance of 380Ω/□ by sputtering using ITO to produce a resistive layer. An acrylic elastomer (KURARITY LA2330 manufactured by KURARAY CO., LTD.) having a relative permittivity of 2.55 was press-molded at 150° C. to produce a sheet-shaped dielectric layer having a thickness of 560 μm. A composite film (manufactured by UACJ) including a 9-μm-thick PET film and 25-μm-thick PET film laminated respectively on the surfaces of a 7-μm-thick aluminum foil was prepared as an electrically conductive layer. The functional layer made of ITO and included in the resistive layer was brought into contact with one principal surface of the dielectric layer to adhere the resistive layer to the dielectric layer. The 25-μm-thick PET film of the electrically conductive layer was brought into contact with the other principal surface of the dielectric layer to adhere the electrically conductive layer to the dielectric layer. An electromagnetic wave-absorbing layer according to Example 1 was produced in this manner. A 100-μm-thick acrylic pressure-sensitive adhesive having a glass transition temperature (Tg) of −66° C. was adhered to both surfaces of a supporting layer that is a 2-mm-thick polyethylene foam (manufactured by Sekisui Chemical Co., Ltd., product name: SOFTLON S #1002) to produce an adhesive layer according to Example 1. The electrically conductive layer (the 9-μm-thick PET film) of the electromagnetic wave-absorbing layer according to Example 1 was brought into contact with one principal surface of the adhesive layer according to Example 1 to adhere the adhesive layer according to Example 1 to the electromagnetic wave-absorbing layer according to Example 1. An electromagnetic wave absorber according to Example 1 was produced in this manner.

Seven aluminum strips each having a width of 10 mm and a thickness of 1 mm were arranged on a 0.8-mm-thick flat aluminum plate at 10-mm intervals and fixed to the respective positions using an adhesive. A substrate A including a surface having 1-mm steps was produced in this manner. The adhesive layer of the electromagnetic wave absorber according to Example 1 was brought into contact with the stepped surface of the substrate A to adhere the electromagnetic wave absorber according to Example 1 to the substrate A. A specimen according to Example 1 was produced in this manner. The condition of the electromagnetic wave absorber according to Example 1 was examined 30 minutes after the adhesion of the electromagnetic wave absorber to the substrate A. The adhesive layer was stuck to the substrate A even at the depressed portions between the aluminum strips.

Example 2

Seven aluminum strips each having a width of 10 mm and a thickness of 0.5 mm were arranged on a 0.8-mm-thick flat aluminum plate at 10-mm intervals and fixed to the respective positions using an adhesive. A substrate B including a surface having 0.5-mm steps was produced in this manner. An adhesive layer as included in the electromagnetic wave absorber according to Example 1 and included in an electromagnetic wave absorber as produced in Example 1 was brought into contact with the stepped surface of the substrate B to adhere the electromagnetic wave absorber as produced in Example 1 to the substrate B. A specimen according to Example 2 was produced in this manner. The condition of the electromagnetic wave absorber as produced in Example 1 was examined 30 minutes after the adhesion of the electromagnetic wave absorber to the substrate B. The adhesive layer was stuck to the substrate B even at the depressed portions between the aluminum strips.

Example 3

An adhesive layer according to Example 3 was produced in the same manner as in Example 1, except that a 1-mm-thick polyethylene foam (manufactured by Sekisui Chemical Co., Ltd., product name: SOFTLON S #1001) was used as a supporting layer instead of the 2-mm-thick polyethylene foam. An electromagnetic wave absorber according to Example 3 was produced in the same manner as in Example 1, except that the adhesive layer according to Example 3 was used instead of the adhesive layer according to Example 1. The adhesive layer of the electromagnetic wave absorber according to Example 3 was brought into contact with the stepped surface of a substrate B to adhere the electromagnetic wave absorber according to Example 3 to the substrate B. A specimen according to Example 3 was produced in this manner. The condition of the electromagnetic wave absorber according to Example 3 was examined 30 minutes after the adhesion of the electromagnetic wave absorber to the substrate B. The adhesive layer was stuck to the substrate B even at the depressed portions between the aluminum strips.

Example 4

An adhesive layer according to Example 4 was produced in the same manner as in Example 1, except that a 0.5-mm-thick slice of a polyethylene foam as used in Example 1 was used as a supporting layer instead of the 2-mm-thick polyethylene foam. An electromagnetic wave absorber according to Example 4 was produced in the same manner as in Example 1, except that the adhesive layer according to Example 4 was used instead of the adhesive layer according to Example 1. The adhesive layer of the electromagnetic wave absorber according to Example 4 was brought into contact with the stepped surface of a substrate B to adhere the electromagnetic wave absorber according to Example 4 to the substrate B. A specimen according to Example 4 was produced in this manner. The condition of the electromagnetic wave absorber according to Example 4 was examined 30 minutes after the adhesion of the electromagnetic wave absorber to the substrate B. The adhesive layer was stuck to the substrate B even at the depressed portions between the aluminum strips.

Example 5

Seven aluminum strips each having a width of 10 mm and a thickness of 0.2 mm were arranged on a 0.8-mm-thick flat aluminum plate at 10-mm intervals and fixed to the respective positions using an adhesive. A substrate C including a surface having 0.2-mm steps was produced in this manner. An adhesive layer as included in the electromagnetic wave absorber according to Example 4 and included in an electromagnetic wave absorber as produced in Example 4 was brought into contact with the stepped surface of the substrate C to adhere the electromagnetic wave absorber as produced in Example 4 to the substrate C. A specimen according to Example 5 was produced in this manner. The condition of the electromagnetic wave absorber as produced in Example 4 was examined 30 minutes after the adhesion of the electromagnetic wave absorber to the substrate C. The adhesive layer was stuck to the substrate C even at the depressed portions between the aluminum strips.

Example 6

An adhesive layer according to Example 6 was produced in the same manner as in Example 1, except that a 5-mm-thick polyethylene foam (manufactured by Sekisui Chemical Co., Ltd., product name: SOFTLON S #3005) was used as a supporting layer instead of the 2-mm-thick polyethylene foam. An electromagnetic wave absorber according to Example 6 was produced in the same manner as in Example 1, except that the adhesive layer according to Example 6 was used instead of the adhesive layer according to Example 1. The adhesive layer of the electromagnetic wave absorber according to Example 6 was brought into contact with the stepped surface of a substrate A to adhere the electromagnetic wave absorber according to Example 6 to the substrate A. A specimen according to Example 6 was produced in this manner. The condition of the electromagnetic wave absorber according to Example 6 was examined 30 minutes after the adhesion of the electromagnetic wave absorber to the substrate A. The adhesive layer was stuck to the substrate A even at the depressed portions between the aluminum strips.

Example 7

An acrylic elastomer (KURARITY LA2330 manufactured by KURARAY CO., LTD.) was press-molded at 150° C. to produce an elastomer sheet A having a thickness of 0.5 mm. An adhesive layer according to Example 7 was produced in the same manner as in Example 1, except that the elastomer sheet A was used as a supporting layer instead of the 2-mm-thick polyethylene foam. An electromagnetic wave absorber according to Example 7 was produced in the same manner as in Example 1, except that the adhesive layer according to Example 7 was used instead of the adhesive layer according to Example 1. The adhesive layer of the electromagnetic wave absorber according to Example 7 was brought into contact with the stepped surface of a substrate C to adhere the electromagnetic wave absorber according to Example 7 to the substrate C. A specimen according to Example 7 was produced in this manner. The condition of the electromagnetic wave absorber according to Example 7 was examined 30 minutes after the adhesion of the electromagnetic wave absorber to the substrate C. The adhesive layer was stuck to the substrate C even at the depressed portions between the aluminum strips.

Example 8

To 100 parts by weight of an EVA resin (EVAFLEX EV250 manufactured by Du Pont-Mitsui Polychemicals Co., Ltd.) was added 300 parts by weight of a carbonyl iron powder YW1 manufactured by New Metals and Chemicals Corporation, Ltd. The materials were kneaded with a mixing roll and then press-molded at 120° C. to produce a sheet-shaped magnetic layer having a thickness of 1200 μm. A composite film (manufactured by UACJ) including a 9-μm-thick PET film and 25-μm-thick PET film laminated respectively on the surfaces of a 7-μm-thick aluminum foil was prepared as an electrically conductive layer. The 25-μm-thick PET film of the electrically conductive layer was brought into contact with one principal surface of the magnetic layer to adhere the electrically conductive layer to the magnetic layer. An electromagnetic wave-absorbing layer according to Example 8 was produced in this manner. An electromagnetic wave absorber according to Example 8 was produced in the same manner as in Example 1, except that the electromagnetic wave-absorbing layer according to Example 8 was used instead of the electromagnetic wave-absorbing layer according to Example 1.

The adhesive layer of the electromagnetic wave absorber according to Example 8 was brought into contact with the stepped surface of a substrate B to adhere the electromagnetic wave absorber according to Example 8 to the substrate B. A specimen according to Example 8 was produced in this manner. The condition of the electromagnetic wave absorber according to Example 8 was examined 30 minutes after the adhesion of the electromagnetic wave absorber to the substrate B. The adhesive layer was stuck to the substrate B even at the depressed portions between the aluminum strips.

Example 9

An adhesive layer according to Example 9 was produced in the same manner as in Example 1, except that a 0.042-mm-thick base paper (manufactured by DAIFUKU PAPER MFG. Co., Ltd.) for a double-faced tape was used as a supporting layer instead of the 2-mm-thick polyethylene foam. An electromagnetic wave absorber according to Example 9 was produced in the same manner as in Example 1, except that the adhesive layer according to Example 9 was used instead of the adhesive layer according to Example 1. Seven aluminum strips each having a width of 10 mm and a thickness of 0.3 mm were arranged on a 0.8-mm-thick flat aluminum plate at 10-mm intervals and fixed to the respective positions using an adhesive. A substrate D including a surface having 0.3-mm steps was produced in this manner. The adhesive layer of the electromagnetic wave absorber according to Example 9 was brought into contact with the stepped surface of the substrate D to adhere the electromagnetic wave absorber according to Example 9 to the substrate D. A specimen according to Example 9 was produced in this manner. The condition of the electromagnetic wave absorber according to Example 9 was examined 30 minutes after the adhesion of the electromagnetic wave absorber to the substrate D. The adhesive layer was stuck to the substrate D even at the depressed portions between the aluminum strips.

Example 10

An adhesive layer according to Example 10 was produced in the same manner as in Example 1, except that a 10-mm-thick ethylene propylene rubber foam (manufactured by Nitto Denko Corporation, product name: EPTSEALER No. 685) was used as a supporting layer instead of the 2-mm-thick polyethylene foam. An electromagnetic wave absorber according to Example 10 was produced in the same manner as in Example 1, except that the adhesive layer according to Example 10 was used instead of the adhesive layer according to Example 1. The adhesive layer of the electromagnetic wave absorber according to Example 10 was brought into contact with the stepped surface of a substrate A to adhere the electromagnetic wave absorber according to Example 10 to the substrate A. A specimen according to Example 10 was produced in this manner. The condition of the electromagnetic wave absorber according to Example 10 was examined 30 minutes after the adhesion of the electromagnetic wave absorber to the substrate A. The adhesive layer was stuck to the substrate A even at the depressed portions between the aluminum strips.

Example 11

Seven aluminum strips each having a width of 10 mm and a thickness of 0.1 mm were arranged on a 0.8-mm-thick flat aluminum plate at 10-mm intervals and fixed to the respective positions using an adhesive. A substrate E including a surface having 0.1-mm steps was produced in this manner. An adhesive layer according to Example 11 was produced in the same manner as in Example 1. The adhesive layer of the electromagnetic wave absorber according to Example 11 was brought into contact with the stepped surface of the substrate E to adhere the electromagnetic wave absorber according to Example 11 to the substrate E. A specimen according to Example 11 was produced in this manner. The condition of the electromagnetic wave absorber according to Example 11 was examined 30 minutes after the adhesion of the electromagnetic wave absorber to the substrate E. The adhesive layer was stuck to the substrate E even at the depressed portions between the aluminum strips.

Comparative Example 1

An adhesive layer as included in the electromagnetic wave absorber according to Example 9 and included in an electromagnetic wave absorber as produced in Example 9 was brought into contact with the stepped surface of a substrate A to adhere the electromagnetic wave absorber as produced in Example 9 to the substrate A. A specimen according to Comparative Example 1 was produced in this manner. The condition of the electromagnetic wave absorber as produced in Example 9 was examined 30 minutes after the adhesion of the electromagnetic wave absorber to the substrate A. The adhesive layer was stuck to the substrate A even at the depressed portions between the aluminum strips.

Comparative Example 2

An adhesive layer according to Comparative Example 2 having a glass transition temperature (Tg) of −29° C. and made of a 50-μm-thick acrylic pressure-sensitive adhesive was prepared. The adhesive layer according to Comparative Example 2 was adhered to an electrically conductive layer (9-μm-thick PET film) as used in the electromagnetic wave-absorbing layer according to Example 1 to produce an electromagnetic wave absorber according to Comparative Example 2. The electromagnetic wave absorber according to Comparative Example 2 was adhered to a substrate D to produce a specimen according to Comparative Example 2. The condition of the electromagnetic wave absorber according to Comparative Example 2 was examined 30 minutes after the adhesion of the electromagnetic wave absorber to the substrate D. The adhesive layer was stuck to the substrate D even at the depressed portions between the aluminum strips.

[Return Loss]

The return loss ΔR was determined as follows for the specimens of Examples and Comparative Examples. First, the reflection amount Rr of a 76-GHz electromagnetic wave was measured according to JIS R 1679:2007 for the specimens of Examples and Comparative Examples. The 76-GHz electromagnetic wave was perpendicularly incident on the specimens of Examples and Comparative Examples. The area irradiated with the 76-GHz electromagnetic wave corresponds to the area of a 120-mm-diameter circle. For the measurement, a 3-mm-thick aluminum plate having a 150-mm-diameter hole was placed on each of the specimens. Moreover, adhesive layers as used in Examples and Comparative Examples were each adhered to a composite film (manufactured by UACJ) including a 9-μm-thick PET film and 25-μm-thick PET film laminated respectively on the surfaces of a 7-un-thick aluminum foil to produce samples according to Examples and Comparative Examples. To produce reference specimens according to Examples and Comparative Examples, the samples according to Examples and Comparative Examples were each adhered to a substrate having the same steps as those of the substrate (substrate A, substrate B, substrate C, substrate D, or substrate E) to which each of the electromagnetic wave absorbers according to Examples and Comparative Examples was adhered. The reflection amount Rt of a 76-GHz electromagnetic wave was measured according to JIS R 1679:2007 for the reference specimens according to Examples and Comparative Examples. The 76-GHz electromagnetic wave was perpendicularly incident on the reference specimens of Examples and Comparative Examples. The return loss ΔR was determined for each of Examples and Comparative Examples by subtracting the reflection amount Rr from the reflection amount Rt. The determined return loss was evaluated according to the following measures. Table 1 shows the results. Comparison between the results of the evaluation of ΔR for Examples and the results of the evaluation of ΔR for Comparative Examples indicates that the electromagnetic wave absorbers according to Examples can exhibit good electromagnetic wave absorption performance when adhered to a surface having a given step.

a: ΔR is 15 dB or more.
x: ΔR is less than 15 dB.

[Young's Modulus of Adhesive Layer]

The adhesive layers as produced in the electromagnetic wave absorbers according to Examples and Comparative Examples were measured for the Young's modulus (tensile elastic modulus) at 23° C. and −30° C. according to JIS K 7161-1. Table 1 shows the results.

[Evaluation of Likelihood of Distortion-Induced Detachment of Electromagnetic Wave Absorber]

As an alternative to evaluation of the likelihood of distortion-induced detachment of the electromagnetic wave absorbers, the specimens according to Examples and Comparative Examples were bent to R30 (a curvature radius of 30 mm) at −30° C. to examine the state of detachment at an end portion of each electromagnetic wave absorber. Table 1 shows the results.

the adhesive layer has a thickness equal to or greater than a reference height determined by subtracting 0.1 mm from the height of the step, and a return loss ΔR defined by the following equation is 15 dB or more:

$$\Delta R = Rt - Rr$$

wherein: Rt is a reflection amount of a 76-GHz electromagnetic wave and is measured according to Japanese Industrial Standards (JIS) R 1679:2007 for a reference specimen obtained by bringing an adhesive layer of a sample into contact with a first surface having a step equal to or lower than a reference thickness determined by adding 0.1 mm to the thickness of the adhesive layer of the electromagnetic wave absorber to adhere the sample to the first surface, the sample consists of a metal foil-including electrically conductive layer and the adhesive layer, and the adhesive layer of the sample is of the same type as the adhesive layer of the electromagnetic wave absorber; the step has a height of 0.1 mm or more, and Rr is a reflection amount of a 76-GHz electromagnetic wave and is measured according to JIS R 1679:2007 for a specimen obtained by bringing the adhesive layer of the electromagnetic wave absorber into contact with a second surface that has the same surface shape as a surface shape of the first surface to adhere the electromagnetic wave absorber to the second surface.

2. The electromagnetic wave absorber according to claim 1, wherein the adhesive layer has a thickness of 0.5 mm to 15 mm.

3. The electromagnetic wave absorber according to claim 1, wherein the adhesive layer has a Young's modulus of 2000 MPa or less at 23° C.

TABLE 1

| | Height t [mm] of step | Thickness [mm] of adhesive layer D | ΔR | D − t | Young's modulus [MPa] of adhesive layer at 23° C. | Young's modulus [MPa] of adhesive layer at −30° C. | Distortion-induced detachment |
|---|---|---|---|---|---|---|---|
| Example 1 | 1.0 | 2.2 | a | 1.2 | 5 | 20 | Not detached |
| Example 2 | 0.5 | 2.2 | a | 1.7 | 5 | 20 | Not detached |
| Example 3 | 0.5 | 1.2 | a | 0.7 | 5 | 20 | Not detached |
| Example 4 | 0.5 | 0.7 | a | 0.2 | 5 | 20 | Not detached |
| Example 5 | 0.2 | 0.7 | a | 0.5 | 5 | 20 | Not detached |
| Example 6 | 1.0 | 5.2 | a | 4.2 | 5 | 20 | Not detached |
| Example 7 | 0.2 | 0.7 | a | 0.5 | 0.5 | 300 | Not detached |
| Example 8 | 0.5 | 2.2 | a | 1.7 | 5 | 20 | Not detached |
| Example 9 | 0.3 | 0.2 | a | −0.1 | 6500 | 6800 | Detached |
| Example 10 | 1.0 | 10.2 | a | 9.2 | 0.2 | 0.8 | Not detached |
| Example 11 | 0.1 | 2.2 | a | 2.1 | 5 | 20 | Not detached |
| Comparative Example 1 | 1.0 | 0.2 | x | −0.8 | 6500 | 6800 | Detached |
| Comparative Example 2 | 0.3 | 0.05 | x | −0.25 | 0.5 | 300 | Detached |

The invention claimed is:

1. An electromagnetic wave absorber comprising:
an electromagnetic wave-absorbing layer; and
an adhesive layer that is disposed on at least one surface of the electromagnetic wave-absorbing layer, wherein
the electromagnetic wave absorber is capable of being adhered to a surface having a step in such a manner that the adhesive layer is in contact with the surface, 4. The electromagnetic wave absorber according to claim 1, wherein the adhesive layer has a Young's modulus of 2000 MPa or less at −30° C.

5. The electromagnetic wave absorber according to claim 1, wherein the adhesive layer comprises a supporting layer.

6. The electromagnetic wave absorber according to claim 5, wherein the supporting layer is made of a foam.

7. The electromagnetic wave absorber according to claim 5, wherein the supporting layer comprises at least one selected from the group consisting of polyethylene terephthalate, polyethylene naphthalate, acrylic resins, polycarbonate, cycloolefin polymers, polyurethanes, acrylic urethane resins, polyolefins, polyethylene, polypropylene, synthetic rubbers, polyvinyl chloride, and polyvinylidene chloride as a main component.

8. The electromagnetic wave absorber according to claim 5, wherein the electromagnetic wave absorber is a $\lambda/4$ electromagnetic wave absorber.

\* \* \* \* \*